(12) United States Patent
Feng et al.

(10) Patent No.: US 8,639,065 B2
(45) Date of Patent: Jan. 28, 2014

(54) SYSTEM HAVING AVALANCHE EFFECT LIGHT SENSOR WITH ENHANCED SENSITIVITY

(75) Inventors: Ning-Ning Feng, Arcadia, CA (US); Shirong Liao, Mira Loma, CA (US); Dawei Zheng, Arcadia, CA (US); Dazeng Feng, El Monte, CA (US)

(73) Assignee: Kotura, Inc., Monterey Park, CA (US)

( * ) Notice: Subject to any disclaimer, the term of this patent is extended or adjusted under 35 U.S.C. 154(b) by 309 days.

(21) Appl. No.: 12/803,136

(22) Filed: Jun. 18, 2010

(65) Prior Publication Data

US 2011/0310467 A1  Dec. 22, 2011

(51) Int. Cl.
*G02B 6/13* (2006.01)

(52) U.S. Cl.
USPC .......... 385/12; 385/3; 385/14; 385/131; 385/132; 385/141

(58) Field of Classification Search
USPC ....................... 385/132; 359/341.1
See application file for complete search history.

(56) References Cited

U.S. PATENT DOCUMENTS

| | | | | |
|---|---|---|---|---|
| 4,276,555 A | * | 6/1981 | Vinal | .................. 257/589 |
| 4,899,200 A | | 2/1990 | Shur et al. | |
| 5,866,936 A | | 2/1999 | Hasnain et al. | |
| 6,104,047 A | | 8/2000 | Watanabe | |
| 6,978,067 B2 | * | 12/2005 | Herbert et al. | .................. 385/39 |
| 2002/0074555 A1 | * | 6/2002 | Kim et al. | .................. 257/79 |
| 2002/0117697 A1 | | 8/2002 | Tanaka et al. | |
| 2003/0164444 A1 | | 9/2003 | Yoneda et al. | |
| 2005/0025443 A1 | * | 2/2005 | Nakaji et al. | .................. 385/131 |
| 2005/0167709 A1 | * | 8/2005 | Augusto | .................. 257/292 |
| 2006/0039666 A1 | | 2/2006 | Knights et al. | |
| 2011/0095167 A1 | * | 4/2011 | Feng et al. | .................. 250/207 |

OTHER PUBLICATIONS

Coldren, et al., Diode Lasers and Photonic Integrated Circuits, Wiley Series in Microwave and Optical Engineering (1995), pp. 356, 358 absent.

Dai, et al., "Resonant Normal-Incidence Separate-Absorption-Charge-Multiplication Ge/Si Avalanche Photodiodes," Sep. 14, 2009/ vol. 17, No. 19/Optics Express, pp. 1-9.

Liu, et al., "Design of Monolithically Integrated GeSi Electro-Absorption Modulators and Photodetectors on an SOI Platform," Jan. 22, 2006/ vol. 15, No. 2/Optics Express, pp. 1-6.

(Continued)

*Primary Examiner* — Mark Robinson
*Assistant Examiner* — Andrew Jordan
(74) *Attorney, Agent, or Firm* — Gavrilovich, Dodd & Lindsey, LLP

(57) ABSTRACT

The system includes a light-transmitting medium positioned on a base. The light-transmitting medium included a ridge and a slab region. The ridge extends upward from the slab region and defines a portion of a waveguide on the base. The waveguide is configured to guide a light signal through the device. The device also includes an avalanche effect light sensor positioned on the base and configured to detect the presence of the light signal. The light sensor includes a light-absorbing medium positioned on the ridge of the light-transmitting medium such that the light signal is coupled from the light-transmitting medium into the light-absorbing medium. The light-transmitting includes a charge layer located at an interface of the light-transmitting medium and the light-absorbing medium. A multiplication region is formed in the slab regions of the light-transmitting medium such that the multiplication region receives charge carriers from the charge layer during the operation of the light sensor.

20 Claims, 6 Drawing Sheets

(56) References Cited

OTHER PUBLICATIONS

Liu, et al., "Waveguide-Integrated, Ultralow-Energy GeSi Electroabsorption Modulators," Nature photonics/vol. 2/ Jul. 2008, pp. 433-437.

Zaoul, et al., "Origin of the Gain-Bandwidth-Product Enhancement in Separate-Absorption-Charge-Multiplication Ge/Si Avalanche Photodiodes," OSA/OFC/NFOEC, pp. 1-3 (2009).

* cited by examiner

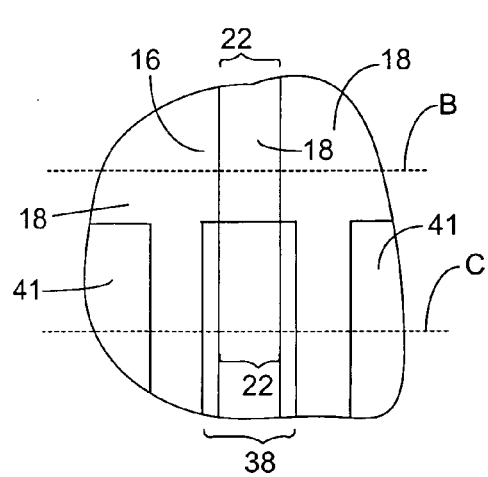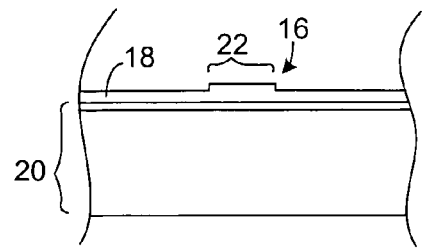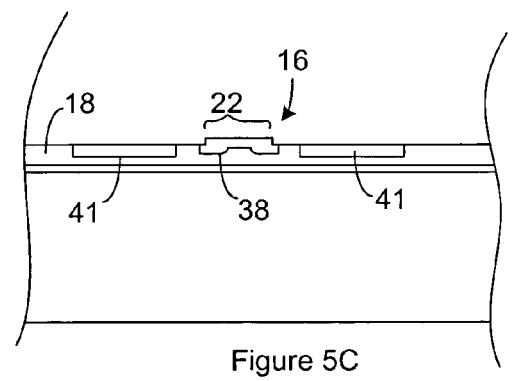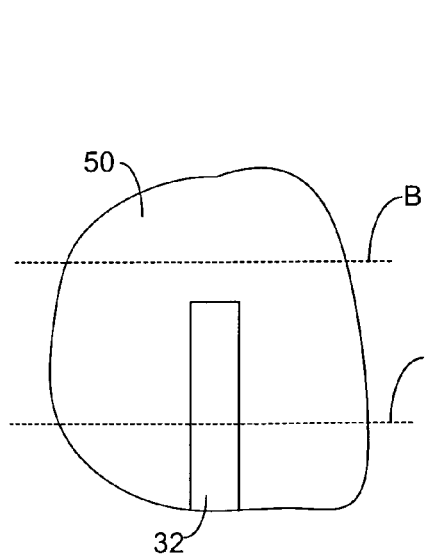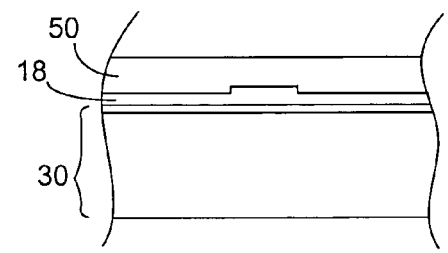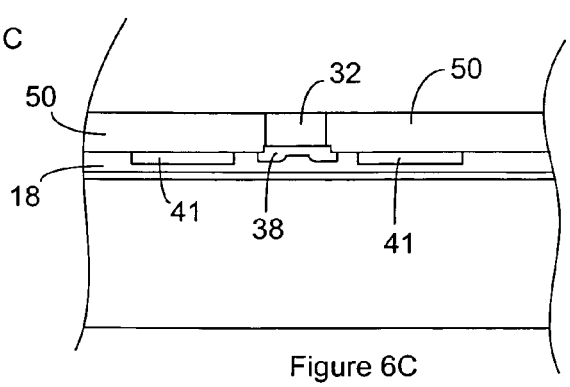
Figure 5A
Figure 5B
Figure 5C
Figure 6A
Figure 6B
Figure 6C

SYSTEM HAVING AVALANCHE EFFECT LIGHT SENSOR WITH ENHANCED SENSITIVITY

GOVERNMENT SUPPORT

This invention was made with Government support under Agreement No. HR0011-08-9-0001 awarded by DARPA. The Government has certain rights in this invention.

FIELD

The present invention relates to optical devices and more particularly to devices having a light sensor.

BACKGROUND

The use of optical and/or optoelectronic devices is increasing in communications applications. These devices can include light sensors that output electrical signals in response to the receipt of light signals. One type of light sensor that can provide the desired level of sensitivity makes use of the avalanche effect. These light sensors have generally been designed to receive the light signals from a direction that is normal to the light sensor. However, as optical and/or optoelectronic devices become more integrated, it is desirable for these light sensors to receive the light signals from a waveguide that is also included on the device. The current structures for these light sensors generally require the use of one or more undesirable epitaxy steps to grow crystalline materials on the device. It is desirable to reduce the number of epitaxy steps employed during the fabrication of these devices.

SUMMARY

An optical device includes a light-transmitting medium positioned on a base. The light-transmitting medium included a ridge and a slab region. The ridge extends upward from the slab region and defines a portion of a waveguide on the base. The waveguide is configured to guide a light signal through the device. The device also includes an avalanche effect light sensor positioned on the base and configured to detect the presence of the light signal. The light sensor includes a light-absorbing medium positioned on the ridge of the light-transmitting medium such that the light signal is coupled from the light-transmitting medium into the light-absorbing medium. The light-transmitting includes a charge layer located at an interface of the light-transmitting medium and the light-absorbing medium. A multiplication region is formed in the slab regions of the light-transmitting medium such that the multiplication region receives charge carriers from the charge layer during the operation of the light sensor. Suitable charge carriers include electron holes and/or electrons.

Methods of forming the device are also disclosed.

BRIEF DESCRIPTION OF THE FIGURES

FIG. 1A is a perspective view of the device.

FIG. 1B is a cross-section of the device shown in FIG. 1A taken along the line labeled B.

FIG. 1C is a cross-section of the optical device shown in FIG. 1B taken along the line labeled C and extending parallel to the longitudinal axis of the light sensor.

FIG. 1D is a cross-section of the device shown in FIG. 1A taken along the line labeled D.

FIG. 1E is a cross-section of the optical device shown in FIG. 1D taken along the line labeled E and extending parallel to the longitudinal axis of the waveguide.

FIG. 5A through FIG. 7C illustrate a method of generating an optical device constructed according to FIG. 1F.

DESCRIPTION

The system includes a light-transmitting medium positioned on a base. The light-transmitting medium included a ridge and a slab region. The ridge extends upward from the slab region and defines a portion of a waveguide on the base. The system also includes an avalanche effect light sensor positioned on the base and configured to detect the presence of light signals. The light sensor includes a light-absorbing medium positioned on the ridge of the light-transmitting medium such that the light signal is coupled from the light-transmitting medium into the light-absorbing medium. The light-transmitting medium includes a charge layer that is at least partially located at an interface of the light-transmitting medium and the light-absorbing medium. The slab region of the light-transmitting medium includes a second doped region. The slab region also includes at least a portion of a multiplication region. That multiplication region extends from the second doped region to the charge layer. Prior light sensor located the second doped region between the ridge and the slab region. However, in the above arrangement, the second doped region can be adjacent to the ridge or spaced apart from the ridge rather than being located between the ridge and the slab region. As a result, there is no need to grow the ridge on top of the second doped region. Accordingly, the structure of the light sensor can be fabricated using a reduced number of epitaxial growth steps.

Figure 1A:
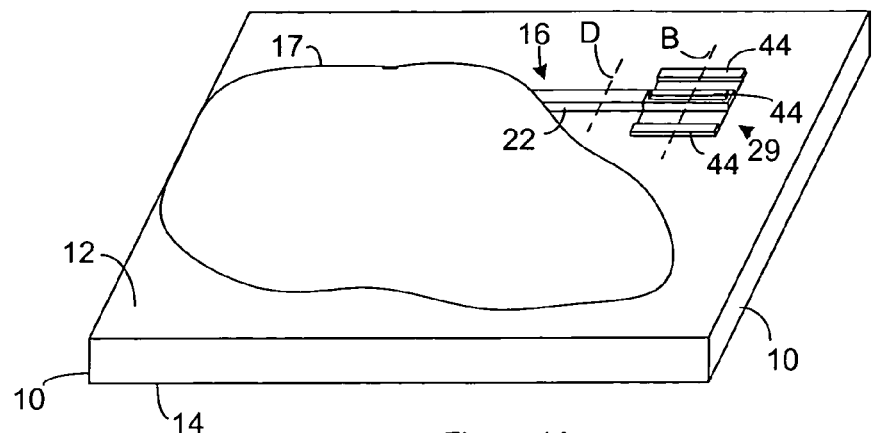
FIG. 1A through FIG. 1E illustrate an optical device having a light sensor configured to receive light signals from a waveguide.
Figure 1B:
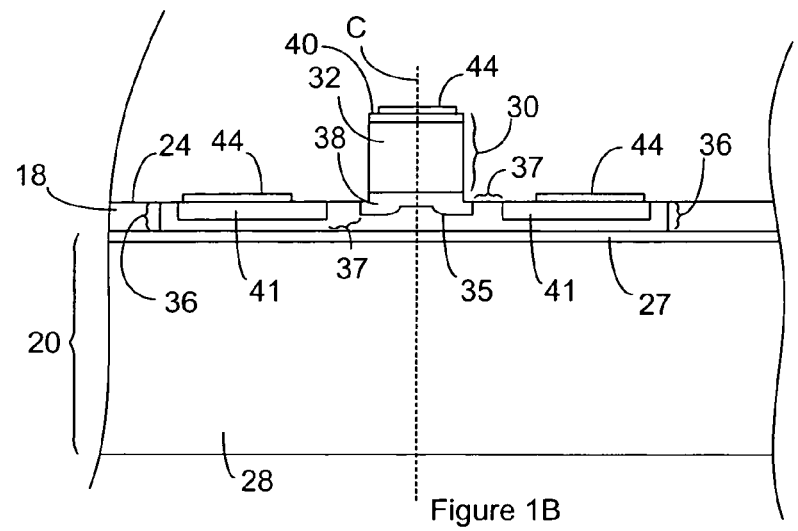
Figure 1C:
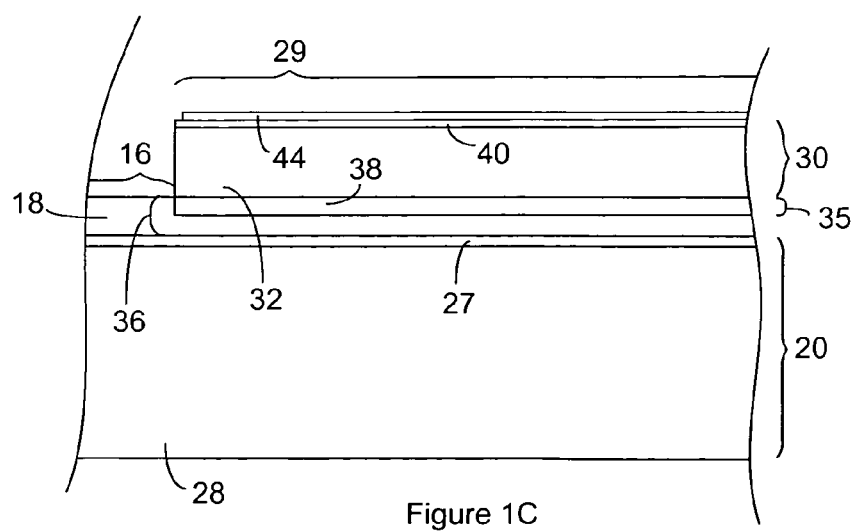
Figure 1D:
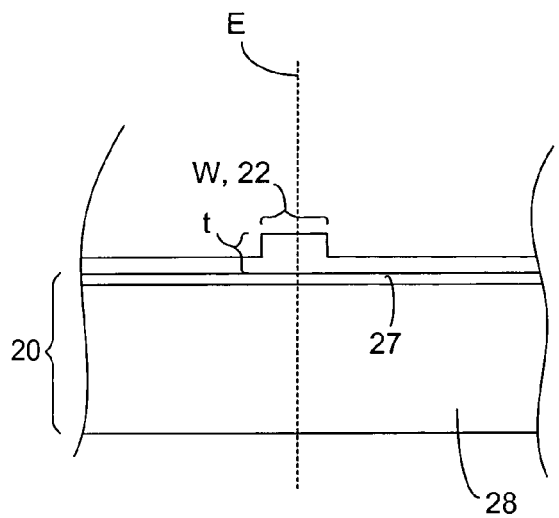
Figure 1E:
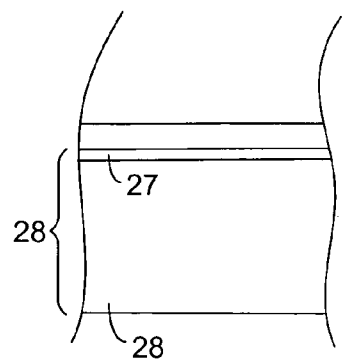

FIG. 1A through FIG. 1E illustrate an optical device having a light sensor configured to receive light signals from a waveguide. FIG. 1A is a perspective view of the device. FIG. 1B is a cross-section of the light sensor. For instance, FIG. 1B is a cross-section of the device shown in FIG. 1A taken along the line labeled B. FIG. 1C is a cross-section of the optical device shown in FIG. 1B taken along the line labeled C and extending parallel to a longitudinal axis of the light sensor. FIG. 1D is a cross-section of the waveguide. For instance, FIG. 1D is a cross-section of the device shown in FIG. 1A taken along the line labeled D. FIG. 1E is a cross-section of the optical device shown in FIG. 1D taken along the line labeled E and extending parallel to the longitudinal axis of the waveguide.

The device is within the class of optical devices known as planar optical devices. These devices typically include one or more waveguides immobilized relative to a substrate or a base. The direction of propagation of light signals along the waveguides is generally parallel to a plane of the device. Examples of the plane of the device include the topside of the base, the bottom side of the base, the topside of the substrate, and/or the bottom side of the substrate.

The illustrated device includes lateral sides 10 (or edges) extending from a topside 12 to a bottom side 14. The propagation direction of light signals along the length of the waveguides on a planar optical device generally extends through the lateral sides 10 of the device. The topside 12 and the bottom side 14 of the device are non-lateral sides.

The device includes one or more waveguides 16 that carry light signals to and/or from optical components 17. Examples of optical components 17 that can be included on the device include, but are not limited to, one or more components selected from a group consisting of facets through which light signals can enter and/or exit a waveguide, entry/exit ports through which light signals can enter and/or exit a waveguide from above or below the device, multiplexers for combining multiple light signals onto a single waveguide, demultiplexers for separating multiple light signals such that different light signals are received on different waveguides, optical couplers, optical switches, lasers that act a source of a light signal, amplifiers for amplifying the intensity of a light signal, attenuators for attenuating the intensity of a light signal, modulators for modulating a signal onto a light signal, light sensors that convert an light signal to an electrical signal, and vias that provide an optical pathway for a light signal traveling through the device from the bottom side 14 of the device to the top side 12 of the device. Additionally, the device can optionally, include electrical components. For instance, the device can include electrical connections for applying a potential or current to a waveguide and/or for controlling other components on the optical device.

The waveguide 16 is defined in a light-transmitting medium 18 positioned on a base 20. For instance, the waveguide 16 is partially defined by a ridge 22 extending upward from a slab region of the light-transmitting medium 18. The portions of the slab region adjacent to the ridge 22 can be defined by the bottom of trenches 24 extending partially into the light-transmitting medium 18 or through the light-transmitting medium 18. Suitable light-transmitting media 18 include, but are not limited to, silicon, polymers, silica, SiN, GaAs, InP and LiNbO$_3$. One or more cladding layers are optionally positioned on the light-transmitting medium 18. The one or more cladding layers can serve as a cladding for the waveguide 16 and/or for the device. When the light-transmitting medium 18 is silicon, suitable cladding layers include, but are not limited to, silicon, polymers, silica, SiN, GaAs, InP and LiNbO$_3$.

The portion of the base 20 adjacent to the light-transmitting medium 18 is configured to reflect light signals from the waveguide 16 back into the waveguide 16 in order to constrain light signals in the waveguide 16. For instance, the portion of the base 20 adjacent to the light-transmitting medium 18 can be an optical insulator 27 with a lower index of refraction than the light-transmitting medium 18. The drop in the index of refraction can cause reflection of a light signal from the light-transmitting medium 18 back into the light-transmitting medium 18. The base 20 can include the optical insulator 27 positioned on a substrate 28. As will become evident below, the substrate 28 can be configured to transmit light signals. For instance, the substrate 28 can be constructed of a light-transmitting medium 18 that is different from the light-transmitting medium 18 or the same as the light-transmitting medium 18. In one example, the device is constructed on a silicon-on-insulator wafer. A silicon-on-insulator wafer includes a silicon layer that serves as the light-transmitting medium 18. The silicon-on-insulator wafer also includes a layer of silica positioned on a silicon substrate. The layer of silica can serving as the optical insulator 27 and the silicon substrate can serve as the substrate 28.

The optical device also includes a light sensor 29 configured to receive a light signal guided by the one or more waveguides 16. The light sensor 29 is configured to convert the light signal to an electrical signal. Accordingly, the light signal can be employed to detect receipt of light signals. For instance, the light sensor 29 can be employed to measure the intensity of a light signal and/or power of a light signal. Although FIG. 1A illustrates a waveguide 16 carrying the light signal between the one or more components and the light sensor 29, the device can be constructed such that the waveguide 16 carries the light signal directly from an optical fiber to the light sensor 29.

The light sensor 29 includes an absorption layer 30 positioned on the ridge 22 of the waveguide 16. The absorption layer 30 can contact the ridge 22. FIG. 1B shows a light-absorbing medium 32 that absorbs light signals serving as the absorption layer 30. The light-absorbing medium 32 can contact the light-transmitting medium 18. Suitable light-absorbing media include media that upon being exposed to an electrical field produce an electron and hole pair in response to receiving a photon. Examples of light-absorbing media 32 that are suitable for detection of light signals at the wavelengths commonly employed in communications applications includes, but are not limited to, germanium, silicon germanium, silicon germanium quantum well, GaAs, and InP. Germanium is suitable for detection of light signals having wavelengths in a range of 1300 nm to 1600 nm.

When the light signal enters the light sensor, the light signal is coupled from the waveguide 16 into the absorption layer 30. For instance, the light-absorbing medium 32 can have a higher index of refraction than the light-transmitting medium 18. The increase in index of refraction can cause the light signal to be coupled into the light-absorbing medium 32.

As will become evident below, during the fabrication of the device, a portion of the light-transmitting medium 18 can be used to grow the light-absorbing medium 32. For instance, when the light-transmitting medium 18 is silicon and the light-absorbing medium 32 is germanium, the germanium can be grown on the silicon. As a result, the use of the light-transmitting medium 18 in both the waveguides 16 and as a seed layer for growth of the light-absorbing medium 32 can simplify the process for fabricating the device.

The light sensor also includes a multiplication layer 36. As is evident in FIG. 1B, the multiplication layer 36 can contact the base 20. The multiplication layer 36 includes a charge layer 35 that is located between a different portion of the multiplication layer 36 and the absorption layer 30 without the absorption layer 30 being located between the portion of the multiplication layer 36 and the base 20. The charge layer 35 can be located between the absorption layer 30 and another region of the multiplication layer. The charge layer 35 can be positioned at an interface between the light-transmitting medium 18 and the light-absorbing medium 32. For instance, the charge layer 35 can contact the light-absorbing medium 32. As is evident from FIG. 1B at least a portion of the charge layer 35 can be located in the ridge 22. Further, the portion of the charge layer 35 positioned in the ridge can span the ridge from side to side. As is also evident from FIG. 1B, the charge layer 35 can extend down the sides of the ridge 22 and into the slab regions 24. As is further evident from FIG. 1B, the portion of the charge layer 35 in the slab region 24 can be located beneath the ridge 22 and can also extend out from under from the ridge 22.

Figure 1F:
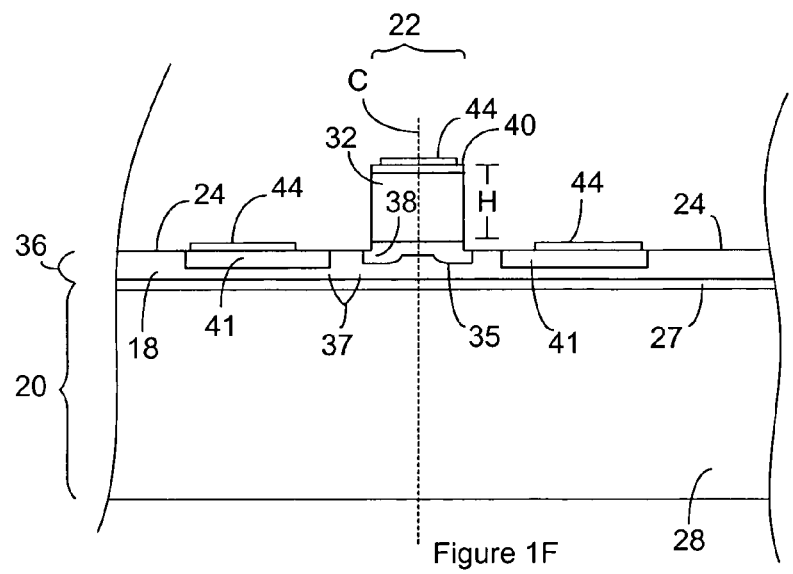
FIG. 1F shows the cross-section of FIG. 1B where the multiplication layer in the light sensor of FIG. 1B is constructed of the same material as a light-transmitting medium shown in FIG. 1B and is continuous with the light-transmitting medium of FIG. 1B.

Although the multiplication layer 36 is shown as a single layer of material, the multiplication layer 36 can include multiple layers of material. Suitable materials for the multiplication layer 36 include, but are not limited to, materials that upon being exposed to an electrical field and receiving an electron can excite additional electrons. Examples include, but are not limited to, semiconductor materials including crystalline semiconductors such as silicon. As a result, in some instances, the light-transmitting medium 18 and the multiplication layer 36 can be the same material. FIG. 1F shows the light sensor of FIG. 1B where the light-transmitting medium 18 and the multiplication layer 36 are shown as the same continuous material. Accordingly, the light-transmitting medium 18 included in the waveguide and the light sensor can be a single continuous layer of material.

The one or more materials that define the multiplication layer 36 can include a doped region 38 that serves as the charge layer 35. The doped region 38 can be an N-type doped region or a P-type doped region. In one example, the multiplication layer 36 is a layer of silicon that includes a doped region 38 with a p-type dopant and the doped region 38 is in contact with the absorption layer 30 as shown in FIG. 1B.

The light-absorbing medium 32 or the absorption layer 30 can include a first doped region 40 that serves as a field source for the electrical field to be formed in the ridge 22. For instance, FIG. 1B illustrates the light-absorbing medium 32 including a first doped region 40 that serves as a field source for the electrical field to be formed in the ridge 22. The first doped region 40 can be continuous and unbroken and can be included in the ridge 22 as is evident from FIG. 1B. The first doped region 40 can be positioned such that another region of the light-absorbing medium 32 is between the first doped region 40 and the multiplication layer 36. In particular, the first doped region 40 can be positioned such that another region of the light-absorbing medium 32 is between the first doped region 40 and the doped region 38 of the multiplication layer 36. As is evident from FIG. 1B, the first doped region 40 can extend up to the topside of the light-absorbing medium 32. In some instances, the light-absorbing medium 32 or the absorption layer 30 includes an undoped region between the multiplication layer 36 and the first doped region 40. The first doped regions 40 can be an N-type doped region or a P-type doped region.

The multiplication layer 36 can include second doped regions 41 that each serves as a field source for the electrical field to be formed in the ridge 22. The second doped regions 41 can each be included in the slab region as is evident from FIG. 1B. As is evident in FIG. 1B, the portion of the slab region that includes the second doped region 41 can also include or consist of the same material as the multiplication layer 36. For instance, the second doped region 41 can be formed in the light-transmitting medium 18 as shown in FIG. 1F. As a result, the second doped region 41 can be formed in silicon that is included in the multiplication layer 36.

As is evident from FIG. 1B, the second doped region 41 can extend up to the topside of the light-transmitting medium 32. The second doped regions 41 can be an N-type doped region or a P-type doped region. Although the second doped regions 41 are shown extending only part way into the multiplication layer 36 in FIG. 1B and FIG. 1F, in some instances, the second doped regions 41 extend through the multiplication layer. For instance, the second doped regions 41 extend down to the base 20 and can contact the base.

The second doped regions 41 can each be spaced apart from the charge layer 35 such that a portion of the light-transmitting medium is between the second doped regions 41 and the charge layer 35. The light-transmitting medium between the second doped regions 41 and the charge layer 35 can serve as multiplication regions 37 in the multiplication layer 36. During operation of the light sensor interaction of an electron traveling through the multiplication regions 37 with the lattice structure of the multiplication regions 37 can cause additional electrons to be excited and can accordingly multiply the number of available electrons as a result of the high electric field in the multiplication region 37.

An N-type doped region can include an N-type dopant. A P-type doped region can include a P-type dopant. Suitable dopants for N-type regions include, but are not limited to, phosphorus and/or arsenic. Suitable dopants for P-type regions include, but are not limited to, boron. The first doped region 40 and the second doped region 41 can be doped so as to be electrically conducting. A suitable concentration for the P-type dopant in a P-type doped region that serves as the first doped region 40 or the second doped region 41 includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$. A suitable concentration for the N-type dopant in an N-type doped region that serves as the first doped region 40 or the second doped region 41 includes, but is not limited to, concentrations greater than $1 \times 10^{15}$ cm$^{-3}$, $1 \times 10^{17}$ cm$^{-3}$, or $1 \times 10^{19}$ cm$^{-3}$, and/or less than $1 \times 10^{17}$ cm$^{-3}$, $1 \times 10^{19}$ cm$^{-3}$, or $1 \times 10^{21}$ cm$^{-3}$.

As noted above, a doped region 38 of the multiplication layer 36 can be an N-type doped region or a P-type doped region that serves as the charge layer 35. Suitable dopants for N-type regions include, but are not limited to, phosphorus and/or arsenic. Suitable dopants for P-type regions include, but are not limited to, boron. Since the doped region 38 serves as the charge layer 35, in some instances, that doped region 38 has a lower concentration of dopant than the first doped region 40 and/or the second doped region 41. The reduced concentration of the doped region 38 relative to the first doped region 40 and/or the second doped region 41 reduces interactions of the optical mode of light signals traveling through the light sensor with heavier doping concentrations and accordingly increases the efficiency of the light sensor. A suitable concentration for the P-type dopant in a doped region 38 that serves as the charge layer 35 includes, but is not limited to, concentrations greater than $1 \times 10^{15}$ cm$^{-3}$, $1 \times 10^{16}$ cm$^{-3}$, or $1 \times 10^{17}$ cm$^{-3}$, and/or less than $1 \times 10^{19}$ cm$^{-3}$, $1 \times 10^{20}$ cm$^{-3}$, or $1 \times 10^{21}$ cm$^{-3}$. A suitable concentration for the N-type dopant in a doped region 38 that serves as the charge layer 35 includes, but is not limited to, concentrations greater than $1 \times 10^{15}$ cm$^{-3}$, $1 \times 10^{16}$ cm$^{-3}$, or $1 \times 10^{17}$ cm$^{-3}$, and/or less than $1 \times 10^{19}$ cm$^{-3}$, $1 \times 10^{20}$ cm$^{-3}$, or $1 \times 10^{21}$ cm$^{-3}$.

The portion of the light transmitting medium 18 between the charge layer 35 and the base 20 can exclude any doped regions or can include one or more lightly doped regions (not shown). In particular, the portion of the light transmitting medium 18 between the top of the ridge and the base 20 can exclude any doped regions or can include one or more lightly doped regions (not shown). The concentration of dopant in the one or more lightly doped regions can be less than the concentration of dopant in the charge layer 35 and/or less than the concentration of dopant in the second doped regions 41. For instance, the concentration of dopant in the lightly doped regions can be less than $1 \times 10^{15}$, $1 \times 10^{16}$, or $1 \times 10^{17}$. The reduced concentration of dopant in the lightly doped regions reduces interaction between the light signal and the dopants and accordingly increases the efficiency of the light sensor.

Additionally, the multiplication regions 37 can be undoped or can be lightly doped multiplication regions. For instance, the portions of the light-transmitting medium between the charge layer 35 and each of the second doped regions 41 can be undoped or lightly doped. The type dopant in the one or more lightly doped region can be the same as the type of dopant in the in the charge layer 35. The concentration of dopant in the multiplication regions can be less than the concentration of dopant in the charge layer 35 and/or less than the concentration of dopant in the second doped regions 41. For instance, the concentration of dopant in the multiplication regions can be less than $1\times10^{15}$, $1\times10^{16}$, or $1\times10^{17}$.

In one example, the multiplication layer 36 includes or consists of silicon, the light-absorbing medium 32 includes or consists of germanium, the first doped region 40 is a p-type region with a dopant concentration of about $1\times10^{20}$ cm$^{-3}$, the second doped regions 41 are each an n-type region with a dopant concentration of about $1\times10^{20}$ cm$^{-3}$, and second doped region 38 that serves as the charge layer 35 is a p-type region with a dopant concentration of about $1\times10^{17}$ cm$^{-3}$.

The first doped region 40 and the second doped regions 41 are each in contact with an electrical conductor 44 such as a metal. Accordingly, the first doped region 40 provides electrical communication between one of the electrical conductors 44 and the light-absorbing medium 32. In particular, the first doped region 40 provides electrical communication between an electrical conductor 44 and the light-absorbing medium 32 included in the ridge 22. The second doped regions 41 each provide electrical communication between one of the electrical conductors 44 and the multiplication layer 36.

During operation of the light sensor, electronics (not shown) in electrical communication with the electrical conductors 44 are used to apply a reverse bias between the first doped region 40 and the second doped regions 41. When the first doped region 40 is an n-type region, the second doped regions 41 are each a p-type region, and the doped region 38 that serves as the charge layer 35 is a p-type region, a positive charge develops at the charge layer 35. As a result, there is an increased electrical field at the charge layer 35. When a photon is absorbed in the undoped region of the absorption layer, a hole and electron pair are generated. The electron is pulled toward the positive charge at the charge layer 35. The charge layer spanning the width of the ridge reduces and/or eliminates pathways that electrons can use to bypass the charge layer. As a result, the electron is received at the charge layer 35 and the increased electrical field at the charge layer 35 excites the electron and causes the electron to accelerate. The electron can accelerate to the extent that interaction of the electron with the lattice structure of the multiplication regions 37 of the layer multiplication layer 36 excites additional hole and electron pairs. In turn, these electrons may excite further hole and electron pairs. In this way, a single photon results in the creation of multiple electrons. These electrons provide electrical current through the light sensor. The current level can be detected and/or measured by the electronics in order to determine the presence and/or intensity of the light signal. As a result, the creation of these additional electrons from a single photon increases the sensitivity of the light sensor through use of the avalanche effect.

The level of doping in the charge layer 35 can affect the operation of the light sensor. For instance, the level of doing in the charge layer can be selected to cause a high level of electric field in the multiplication layer in order to achieve a high gain in the multiplication layer while also providing an electric field in the absorption layer that is low enough to reduce avalanche gain the absorption layer. The low gain in the absorption region can reduce free carriers that can absorb light without generating the electrical current that indicates the presence of light.

When the first doped region 40 is a p-type region, the second doped regions 41 are each an n-type region, and the doped region 38 that serves as the charge layer 35 is a p-type region, the light sensor can be classified as an p-i-p-i-n type light sensor where the "p"s in this classification represent a material having a p-type dopant, the "n" represents an n-type dopant and the "i"s represent an intrinsic region. This classification as a p-i-p-i-n type light sensor represents that the electrical field is formed through a sequence of materials that include a material with a p-type dopant that contacts an intrinsic region that contacts a material with a p-type dopant that contacts an intrinsic region that contacts a material with an n-type dopant. Alternately, in another embodiment, the light sensor is constructed as an n-i-n-i-p type light sensor where electron holes serve as the charge carriers.

Figure 2:
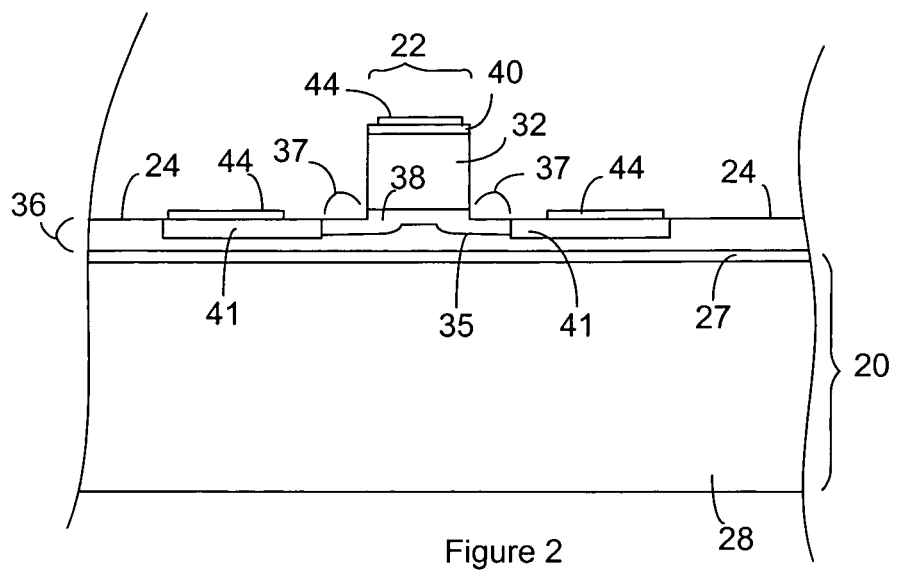
FIG. 2 shows an alternative to the cross-section of FIG. 1B.

The second doped region 41 can directly contact the doped region 38 that serves as the charge layer 35 as shown in FIG. 2. As an example, FIG. 2 shows the light sensor of FIG. 1F with the second doped region 41 directly contacting the doped region 38 that serves as the charge layer 35. In some instances, the light sensor of FIG. 2 has the advantage that it can optionally be fabricated with a broader doped region 38 than is employed in the light sensor of FIG. 1B and/or FIG. 1F. As a result, the light sensor of FIG. 2 may relax fabrication challenges associated with forming a narrower doped region 38.

When the first doped region 40 is a n-type region, the second doped regions 41 are each an p-type region, and the doped region 38 that serves as the charge layer 35 is a p-type region, the light sensor can be classified as a p-i-p-n type light sensor. For instance, the electrical field is formed through a sequence of materials that include a material with a p-type dopant that contacts an insulator that contacts a material with a p-type dopant that an insulator that contacts a material with a n-type dopant. Alternately, in another embodiment, the light sensor is constructed as an n-i-n-p type light sensor where electron holes serve as the charge carriers.

Figure 3:
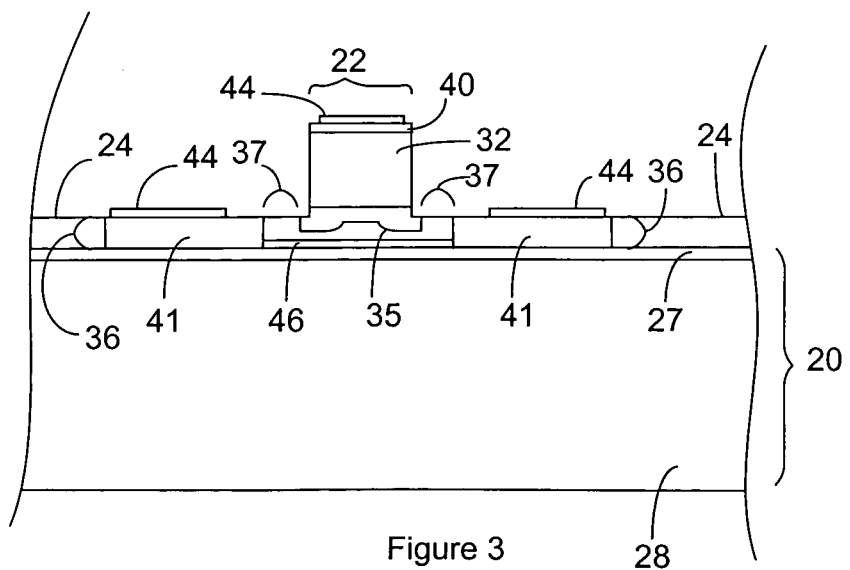
FIG. 3 shows an alternative to the cross-section of FIG. 1B.

The multiplication layer can optionally include a third doped region that can increase the verticality of the electrical field formed in the light sensor. For instance, FIG. 3 illustrates the light sensor of FIG. 1B with a third doped region 46 positioned between the absorption layer 30 and the base 20. In particular, the third doped region 46 is positioned between the doped region 38 and the base 20. A region of the multiplication layer 36 can be between the third doped region 46 and the doped region 38. Accordingly, a region of the light-transmitting medium 18 can be located between the third doped region 46 and the doped region 38.

The third doped region 46 is in electrical communication with one or more of the second doped regions 41. For instance, FIG. 3 illustrates the second doped regions 41 extending down to the base 20 and the third doped region 46 is in electrical communication with each of the second doped regions 41. FIG. 3 illustrates the third doped region 46 contacting each of the second doped regions 41. The third doped region 46 can be the same type of doped region as the one or more second doped regions 41 in electrical communication with the third doped region 46. For instance, when the second doped regions 41 are each an p-type region, the third doped region 46 can be an p-type region. Accordingly, electrical energy is conducted from one or more of the second doped regions 41 into the third doped region 46. The conduction of this electrical energy into a location under the ridge, and accordingly under the first doped region 40, increases the vertical nature of the electrical filed formed in the light sensor. The increase in the verticality of the resulting electrical filed can increase the uniformity of the electrical field in the light sensor and can accordingly increase the efficiency of the light sensor.

The concentration of the dopant in the third doped region 46 can be less than the concentration of the dopant in the second doped regions 41 to reduce optical loss caused by free carriers.

In each of the light sensor disclosed above, the first doped region 40 and the doped region 38 are the same type of region. For instance, the first doped region and the doped region are both a p-type region or are both an n-type region. The one or more second doped regions 41 are a different type of region than the doped region 38. For instance, the doped region 38 is a p-type region and the one or more second doped regions 41 are an n-type region or the doped region 38 is an n-type region and the one or more second doped regions 41 are each a p-type region. When the light sensor includes a region third doped region 46 as shown in FIG. 3, the third doped region can be the same type of region as the one or more second doped regions 41. For instance, the one or more second doped regions 41 are each a p-type region and the third doped region is a p-type region or the one or more second doped regions 41 are each an n-type region and the third doped region is an n-type region.

As noted above, the light sensor is suitable for use with waveguide dimensions that are suitable for use in communications applications. Accordingly, a suitable thickness for the waveguide 16 (labeled t in FIG. 1D) includes, but is not limited to, heights greater than 0.2 µm, 1 µm, 2 µm, and 3 µm. A suitable width for the waveguide 16 (labeled w in FIG. 1D) includes, but is not limited to, widths greater than 0.35 µm, 2 µm, and 3 µm. Suitable waveguide dimension ratios (width of the waveguide 16: height of the waveguide 16) include, but are not limited to, ratios greater than 0.15:1, 0.5:1, and 1:1 and/or less that 0.25:1, 1:1, and 2:1. A suitable thickness for the slab regions adjacent to the waveguide includes, but is not limited to, a thickness greater than 0.05 µm, 0.1 µm, 0.5 µm, or 1 µm and/or less than 1.5 µm, 2 µm, or 3 µm.

In the light sensor, a suitable combined thickness for the absorption layer 30 (labeled T in FIG. 1F where the ridge 22 does not include the electrical conductor 44) includes, but is not limited to, a thickness greater than 0.1 µm, 1.0 µM, or 3.0 µm and/or less than 3.5 µm, 4 µm, or 5 µm. A suitable thickness for the slab regions adjacent to the waveguide includes, but is not limited to, a thickness greater than 0.1 µm, 0.5 µm, or 1 µm and/or less than 1.5 µm, 2 µm, or 3 µm.

As noted above, in some instances, at least a portion of the charge layer 35 is located in the ridge and can span the width of the ridge. The charge layer is configured such that at least 3% of the height of the ridge (labeled H in FIG. 1F), at least 5% of the height of the ridge, or at least 10% of the height of the ridge is occupied by the charge layer and/or less than 10% of the height of the ridge, 30% of the height of the ridge, or 60% of the height of the ridge is occupied by the charge layer.

In one example of the light sensor, the thickness of the ridge 22 is 0.06 µm, the thickness of the slab region adjacent to the ridge 22 is 0.15 µm, the thickness of the charge layer in the ridge is 0.03 µm, and the width of the ridge is 0.5 µm.

Rather than using first doped region 40 and the second doped region 41 as the field sources, electrical conductors 44 such as metal can be used as the field sources. For instance, the first doped region 40 and the second doped region 41 need not be formed and electrical conductors can be formed over the locations of the first doped region 40 and the second doped region 41. The electrical conductors can then serve as the field sources.

Figure 4:
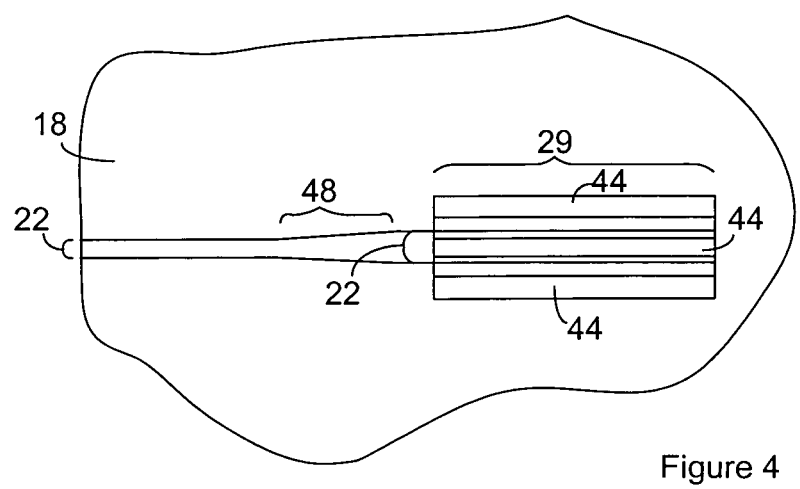
FIG. 4 is a topview of an optical device where the waveguide includes a horizontal taper.

FIG. 4 is a topview of an optical device where the waveguide 16 includes a taper 48. The taper 48 can be a horizontal taper and need not include a vertical taper although a vertical taper is an option. The taper 48 is positioned before the light sensor. For instance, the horizontal taper occurs in the light-transmitting medium 18 rather than in the light-absorbing medium 32. The taper 48 allows the light-absorbing medium 32 to have a broader width than the waveguide 16. The increased width of the light-absorbing medium 32 increases responsivity of the device. The optical component preferably excludes additional components between the taper and light sensor although other components may be present.

The optical device can be constructed using fabrication technologies that are employed in the fabrication of integrated circuits, optoelectronic circuits, and/or optical devices. For instance, the ridge 22 for the waveguide 16 can be formed in the light-transmitting medium 18 using etching technologies on a silicon-on-insulator wafer. Horizontal tapers can be readily formed using masking and etching technologies. Suitable methods for forming vertical tapers are disclosed in U.S. patent application Ser. No. 10/345,709, filed on Jan. 15, 2003, entitled "Controlled Selectivity Etch for Use with Optical Component Fabrication," and incorporated herein in its entirety.

The optical device can be constructed using integrated circuit fabrication technologies. For instance, FIG. 5A through FIG. 7C illustrate a method of generating an optical device constructed according to FIG. 1F. The method is illustrated using a silicon-on-insulator wafer or chip as the starting precursor for the optical device. However, the method can be adapted to platforms other than the silicon-on-insulator platform.

A wafer can be masked and etched so as to form the device precursor of FIG. 5A through FIG. 5C. FIG. 5A is a topview of the device precursor. FIG. 5B is a cross-section of the device precursor shown in FIG. 5A taken along the line labeled B. FIG. 5C is a cross-section of the device precursor shown in FIG. 5A taken along the line labeled C. The etch forms the ridge 22 of the waveguide 16. After the etch, the mask is removed. After removal of the mask, another mask is formed on the device precursor, a dopant implantation is performed on the result, and the mask is then removed. This sequence of mask formation, implantation, and mask removal is repeated so as to form the second doped regions 41 and the doped region 38 shown in FIG. 5A through FIG. 5C. Suitable masks for each of the above steps include photoresists but hard mask such as oxides can be used for one or more of the masks.

A second mask 50 can be formed on the device precursor of FIG. 5A through FIG. 5C so as to provide the device precursor of FIG. 6A through FIG. 6C. FIG. 6A is a topview of the device precursor. FIG. 6B is a cross-section of the device precursor shown in FIG. 6A taken along the line labeled B. FIG. 6C is a cross-section of the device precursor shown in FIG. 6A taken along the line labeled C. The second mask 50 leaves the region of the device precursor where the light-absorbing medium 32 is to be formed and protects the remainder of the device precursor. Suitable second masks 50 include, but are not limited to, hard masks such as oxides. The light-absorbing medium 32 is grown on the portion of the ridge 22 that includes the doped region 38. When the light-absorbing medium 32 is germanium and the light-transmitting medium 18 is silicon, a suitable method for growing the light-absorbing medium 32 on the ridge 22 includes epitaxial growth of the light-absorbing medium 32 on the ridge 22. After growth of the light-absorbing medium 32 on the ridge 22, the device can be planarized as shown in FIG. 6C. Suitable planarization methods include, but are not limited to, chemical-mechanical polishing (CMP).

Figures 7A, 7B, 7C:
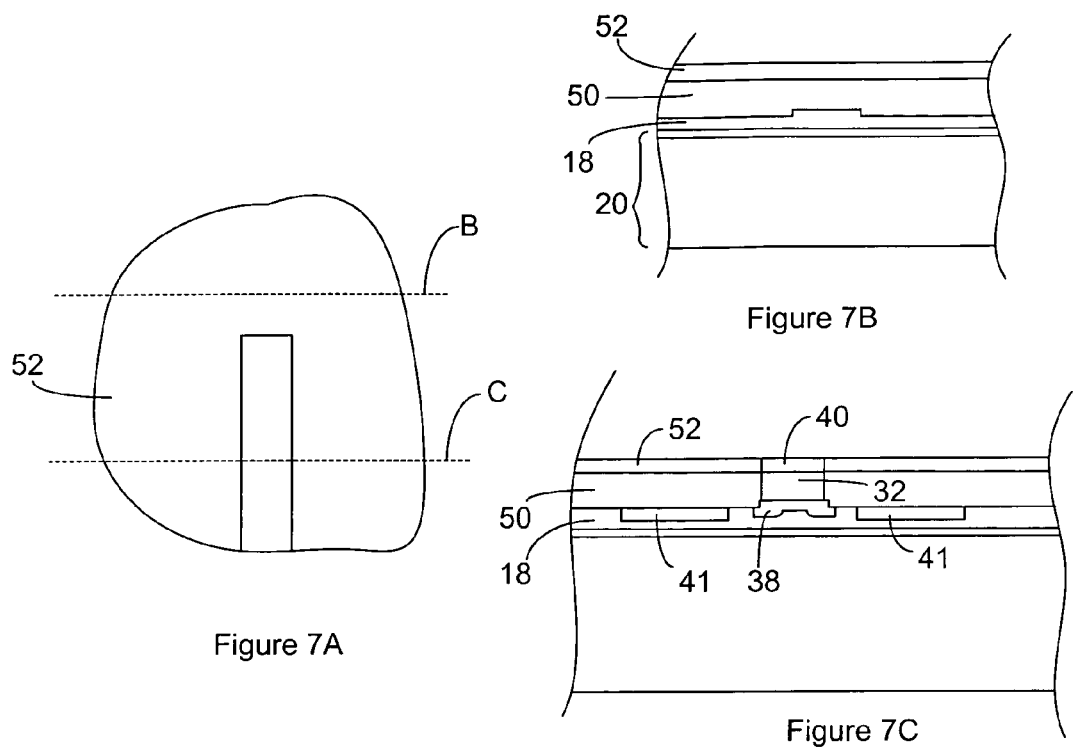

A third mask 52 can be formed on the device precursor of FIG. 6A through FIG. 6C so as to provide the device precursor of FIG. 7A through FIG. 7C. FIG. 7A is a topview of the device precursor. FIG. 7B is a cross-section of the device precursor shown in FIG. 7A taken along the line labeled B. FIG. 7C is a cross-section of the device precursor shown in FIG. 7A taken along the line labeled C. The third mask 52 leaves the region of the device precursor where the first doped region 40 is to be formed exposed. The second mask 50 and/or the third mask protect the remainder of the device precursor. Suitable third masks 52 include, but are not limited to, photoresists. A dopant implantation is performed on the device precursor so as to form the first doped region 40 shown in FIG. 7A through FIG. 7C.

The second mask 50 and the third mask 52 are removed from the device precursor of FIG. 7A through FIG. 7C. Integrated circuit manufacturing techniques can then be used to form the electrical conductors (labeled 44 in FIG. 1F) on the device precursor so as to provide the optical device of FIG. 1F.

Although the light sensor is disclosed above as having two second doped regions, each of the above light sensors can be constructed with a single second doped region. Accordingly, the light sensors can include a single multiplication region.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. An optical device, comprising:
    a light-transmitting medium positioned on a base, the light-transmitting medium including a ridge and a slab region,
        the ridge extending upward from the slab region and the ridge defining a portion of a waveguide on the base,
        the waveguide being configured to guide a light signal through the light-transmitting medium;
    an avalanche effect light sensor positioned on the base and configured to detect the light signal,
        the light sensor including a light-absorbing medium positioned on the ridge of the light-transmitting medium and being positioned such that the ridge of the light-transmitting medium is between the base and the light-absorbing medium,
        the light-absorbing medium being arranged such that the light signal is coupled from the light-transmitting medium into the light-absorbing medium,
    a charge layer between the light-transmitting medium and the light-absorbing medium; and
        a multiplication region in the slab region of the light-transmitting medium such that the multiplication region receives charge carriers from the charge layer during operation of the light sensor.

2. The device of claim 1, further comprising:
    a second doped region in the slab region of the light-transmitting medium and the multiplication region extending from the charge layer to the second doped region.

3. The device of claim 2, wherein the second doped region extends into the light-transmitting medium from an upper surface of the light-transmitting medium and a lower surface of the light-transmitting medium is between the light-transmitting medium and the base.

4. The device of claim 3, wherein the second doped region is spaced apart from the ridge.

5. The device of claim 4, wherein the second doped region is spaced apart from the charge layer.

6. The device of claim 2, wherein the charge layer is a doped region of the light-transmitting medium and the charge layer has a different type of dopant than the second doped region.

7. The device of claim 6, wherein a concentration of dopant in the charge layer is less than a concentration of dopant in the second doped region.

8. The device of claim 1, wherein the charge layer extends down the sides of the ridge and into the slab region.

9. The device of claim 8, wherein the portion of the charge layer in the slab region extends out from under the ridge.

10. The device of claim 9, further comprising:
    a second doped region in the slab region of the light-transmitting medium, and
    the multiplication region extending from the charge layer to the second doped region.

11. The device of claim 10, wherein the second doped region is spaced apart from the charge layer.

12. The device of claim 1, wherein the multiplication region is one of several multiplication regions in the slab region of the light-transmitting medium and at least two of the multiplication regions are positioned on opposing sides of the ridge.

13. The device of claim 1, wherein the portion of the slab region located between the charge layer and the base excludes any doped regions.

14. The device of claim 1, wherein a third doped region is located between the charge layer and the base,
    the third doped region being spaced apart from the charge layer, and
    the third doped region being a doped region of the light-transmitting medium.

15. The device of claim 1, wherein the light sensor is positioned so as to receive the light signal from the waveguide and the light-absorbing medium is positioned on only a portion of the ridge of the light-transmitting medium.

16. The device of claim 15, wherein the ridge of the light-transmitting medium has a length and the light-absorbing medium is positioned on only a portion of the ridge as a result of the light-absorbing medium being positioned on only a portion of the length of the ridge of the light-transmitting medium.

17. The device of claim 16, wherein the waveguide is configured to guide the light signal between the light sensor and another optical component on the base.

18. The device of claim 17, wherein the light-transmitting medium consists of silicon.

19. The device of claim 18, wherein the light-transmitting medium serves as the multiplication region.

20. The device of claim 1, wherein the base includes an optical insulator on a substrate, the optical insulator having a lower index of refraction than the light-transmitting medium,
    the optical insulator is between the substrate and the light-transmitting medium and the optical insulator contacts the light-transmitting medium.

* * * * *